(12) United States Patent
Vincent et al.

(10) Patent No.: US 12,727,448 B2
(45) Date of Patent: Sep. 1, 2026

(54) DONOR SUBSTRATE FOR THE TRANSFER OF A THIN LAYER AND ASSOCIATED TRANSFER METHOD

(71) Applicants: Commissariat À L'énergie Atomique Et Aux Énergies Alternatives, Paris (FR); Soitec, Bernin (FR)

(72) Inventors: Larry Vincent, Grenoble (FR); Shay Reboh, Grenoble (FR); Lucie Le Van-Jodin, Grenoble (FR); Frédéric Milesi, Grenoble (FR); Ludovic Ecarnot, Bernin (FR); Gweltaz Gaudin, Crolles (FR); Didier Landru, Le Champ-près-Froges (FR)

(73) Assignees: Soitec, Bernin (FR); Commissariat À L'énergie Atomique Et Aux Énergies Alternatives, Paris (FR)

( * ) Notice: Subject to any disclaimer, the term of this patent is extended or adjusted under 35 U.S.C. 154(b) by 458 days.

(21) Appl. No.: 18/255,574

(22) PCT Filed: Nov. 19, 2021

(86) PCT No.: PCT/FR2021/052047
§ 371 (c)(1),
(2) Date: Jun. 1, 2023

(87) PCT Pub. No.: WO2022/117930
PCT Pub. Date: Jun. 9, 2022

(65) Prior Publication Data

US 2024/0030061 A1 Jan. 25, 2024

(30) Foreign Application Priority Data

Dec. 1, 2020 (FR) ...................................... 2012496

(51) Int. Cl.
*H10P 90/00* (2026.01)
*H10P 14/20* (2026.01)
(Continued)

(52) U.S. Cl.
CPC ........ *H10P 90/1916* (2026.01); *H10P 50/642* (2026.01); *H10P 90/126* (2026.01);
(Continued)

(58) Field of Classification Search
CPC ......... H01L 21/76254; H01L 21/02667; H01L 21/02592; H10D 84/038; H10P 90/1916;
(Continued)

(56) References Cited

U.S. PATENT DOCUMENTS 5,882,987 A * 3/1999 Srikrishnan ....... H01L 21/76254 438/455
2004/0067622 A1 4/2004 Akatsu et al.
(Continued)

FOREIGN PATENT DOCUMENTS

FR 2978603 A1 2/2013
JP 11-121377 A 4/1999
(Continued)

OTHER PUBLICATIONS

Baumgart H et al., "Evaluation of wafer bonding and etch back for SOI technology" Philips Journal of Research, Elsevier, Amsterdam, NL, vol. 49, No. 1, (Jan. 1, 1995), pp. 91-124.
(Continued)

*Primary Examiner* — Davienne N Monbleau
*Assistant Examiner* — Emily Farmer
(74) *Attorney, Agent, or Firm* — TraskBritt

(57) ABSTRACT

A donor substrate for transferring a single-crystal thin layer made of a first material, onto a receiver substrate. The donor substrate comprises: —a buried weakened plane delimiting an upper portion and a lower portion of the donor substrate,
(Continued)

—in the upper portion, a first layer, a second layer adjacent to the buried weakened plane, and a stop layer between the first layer and the second layer, the first layer composed of the first material, the stop layer being formed of a second material, —an amorphized sub-portion, made amorphous by ion implantation, having a thickness less than that of the upper portion, and including at least the first layer; the second layer comprising at least one single-crystal sub-layer, adjacent to the buried weakened plane. Two embodiments of a method may be used for transferring a single-crystal thin layer from the donor substrate.

20 Claims, 4 Drawing Sheets

(51) Int. Cl.
*H10P 50/64* (2026.01)
*H10W 10/00* (2026.01)
*H10W 10/10* (2026.01)
*H10W 10/13* (2026.01)

(52) U.S. Cl.
CPC ....... *H10W 10/0127* (2026.01); *H10W 10/13* (2026.01); *H10W 10/181* (2026.01); *H10P 14/3802* (2026.01)

(58) Field of Classification Search
CPC ... H10P 50/642; H10P 90/126; H10P 14/3802
See application file for complete search history.

(56) References Cited

U.S. PATENT DOCUMENTS

2013/0029474 A1 1/2013 Gaudin et al.
2017/0178950 A1* 6/2017 Batude .................. H01L 21/185
2018/0294182 A1* 10/2018 Wang ................ H01L 21/02381

FOREIGN PATENT DOCUMENTS

JP 2006-324530 A 11/2006
JP 2013-030773 A 2/2013
KR 10-2005-0084568 A 8/2005
KR 10-2013-0014354 A 2/2013

OTHER PUBLICATIONS

Hartmann et al., Critical Thickness for Plastic Realization of SiGe on Si(001) Revisited, AIP Journal of Applied Physics, vol. 110(2011), 9 pages.
International Search Report for International Application No. PCT/FR21/052047, mailed Jul. 25, 2022, 02 pages.
International Written Opinion for International Application No. PCT/FR2021/052047, mailed Jul. 25, 2022, 06 pages.
Korean Office Action for Application No. 10-2023-7019431 dated Aug. 4, 2025, 13 pages with English translation.
Japanese Office Action for Application No. 2023-533212 dated Dec. 1, 2025, 10 pages with English translation.

* cited by examiner

DONOR SUBSTRATE FOR THE TRANSFER OF A THIN LAYER AND ASSOCIATED TRANSFER METHOD

CROSS-REFERENCE TO RELATED APPLICATIONS

This application is a national phase entry under 35 U.S.C. § 371 of International Patent Application PCT/FR2021/052047, filed Nov. 19, 2021, designating the United States of America and published as International Patent Publication WO 2022/117930 A2 on Jun. 9, 2022, which claims the benefit under Article 8 of the Patent Cooperation Treaty to French Patent Application Serial No. FR2012496, filed Dec. 1, 2020.

TECHNICAL FIELD

The present disclosure belongs to the field of semiconductors and microelectronics. It relates to a donor substrate suitable for the transfer of a thin layer onto a receiver substrate, and, in particular, a transfer at low temperatures onto a receiver substrate comprising finished or partially finished electronic components. The present disclosure also relates to a transfer method using the donor substrate.

BACKGROUND

The three-dimensional (3D) integration of circuits has been under strong development for several years, since it makes it possible to associate different functions while minimizing the space requirement of the system. 3D integration is based on the vertical stack of layers of electronic devices. Such a stack requires the formation of layers of crystalline materials above existing layers of devices. Such devices are neither homogeneous nor crystalline, preventing the use of conventional crystalline thin-film growth techniques, such as epitaxy. It is also required to remain at low temperatures since the layers of devices already manufactured, which may include, in particular, metallization levels, often have limited temperature resistance.

3D integration thus preferentially implements the thin-film transfer techniques, from a donor substrate to the receiver substrate, which may comprise one or more layers of devices.

Several known layer transfer methods are based on assembly by direct bonding of the donor substrate (from which the desired thin crystalline layer will be derived) onto the receiver substrate. The donor substrate then undergoes a thinning step, at the end of which the thin layer is formed. This thinning step may be performed using various techniques that are known in the prior art, notably:

- the Smart Cut™ method, particularly suited to the formation of very thin layers (typically with a thickness of between a few nanometers and 1 micron): it is based on implanting gaseous species in the donor substrate, at the face to be assembled thereof, prior to the assembly step, in order to form a buried weakened plane; after assembly, during a fracture step, the donor substrate is separated along the weakened plane, in order to leave only the thin layer attached to the receiver substrate.
- the mechanical-chemical thinning methods, including mechanical lapping, mechanical-chemical polishing and chemical etching, especially suited to the formation of layers with thicknesses of between a few microns and some tens or even hundreds of microns.

Of course, the techniques cited above are not exhaustive and other known techniques may be used to thin the donor substrate.

As stated, the Smart Cut™ method is particularly suitable for forming very thin layers. After transfer, it is necessary to perform several operations to make the transferred layer usable in order to manufacture electronic devices; repairing the implantation defects, smoothing the fractured surface, thinning this same layer and closure of the bonding interface. These operations are usually carried out at high temperature, in particular, in the context of the manufacture of SOI (Silicon on Insulator) structures. In the case of interest to us, 3D integration, they must be carried out at low temperatures in order not to damage the underlying device layer.

Document FR2978603 proposes a solution facilitating the repair of implantation defects at low temperatures.

BRIEF SUMMARY

The present disclosure aims to improve the state of the art, by proposing a donor substrate especially suitable for the transfer of a single-crystal layer of high quality onto a receiver substrate, most particularly in the case where the receiver substrate is not compatible with high temperatures due to the presence of electronic devices. The present disclosure also relates to a method for the transfer of a thin layer onto a receiver substrate, from the donor substrate.

The present disclosure relates to a donor substrate for the transfer of a single-crystal thin layer made of a first material onto a receiver substrate, the donor substrate having a front side and a back side, and comprising:

- a buried weakened plane that delimits an upper portion and a lower portion of the donor substrate,
- in the upper portion, a first layer on the side of the front side, a second layer adjacent to the buried weakened plane, and a stop layer inserted between the first layer and the second layer, the first layer being composed of the first material and being intended to form the single-crystal thin layer, the stop layer being formed of a second material that allows selective etching with respect to the first material,
- an amorphized sub-portion, made amorphous through ion implantation, having a thickness strictly less than that of the upper portion, and including at least the first layer; the second layer comprising at least one single-crystal sub-layer, adjacent to the buried weakened plane, the sub-layer being intended to form a recrystallization seed for the amorphized sub-portion.

According to advantageous features of the present disclosure, taken alone or in any feasible combination:

- the amorphized sub-portion includes the stop layer;
- the amorphized sub-portion includes a portion of the second layer, adjacent to the stop layer;
- the second layer is composed of the first material;
- the first material is selected from silicon, germanium or a silicon/germanium alloy;
- the second material is selected from silicon germanium or highly doped silicon;
- the first layer has a thickness between 5 nm and 500 nm;
- the stop layer has a thickness between 2 and 100 nm;
- the second layer has a thickness between 50 and 1000 nm;
- the donor substrate comprises an amorphous silicon bonding layer disposed on the first layer;

the bonding layer has a thickness between 2 and 20 nm;

the donor substrate comprises an intermediate layer made of silicon oxide, interposed between the first layer and the bonding layer;

the intermediate layer has a thickness between 10 and 200 nm;

The present disclosure also relates to a method for the transfer of a single-crystal thin layer made of a first material onto a receiver substrate.

According to a first embodiment, the transfer method comprises the following steps:

a) providing a donor substrate as above, b) providing a receiver substrate;

c) assembling by direct bonding the front side of the donor substrate onto the receiver substrate, d) separating along the buried weakened plane in order to transfer the upper portion of the donor substrate onto the receiver substrate, e) recrystallizing the amorphized sub-portion, in order to restore a single-crystal quality to the first layer, which then forms the single-crystal thin layer, f) chemically etching the second layer, then chemically etching the stop layer selectively with respect to the single-crystal thin layer.

Advantageously, the recrystallizing step e) comprises a heat treatment at a temperature of between 450° C. and 900° C., preferably between 450° C. and 550° C.

According to a second embodiment, the transfer method comprises the following steps:

a) providing a donor substrate as above, a') locally recrystallizing the amorphized sub-portion to restore a single-crystal quality to the first layer, without affecting the buried weakened plane, the first recrystallized layer forming the single-crystal thin layer, b) providing a receiver substrate;

c) assembling by direct bonding the front side of the donor substrate onto the receiver substrate, d) separating along the buried weakened plane in order to transfer the upper portion of the donor substrate onto the receiver substrate, f) chemically etching the second layer, then chemically etching the stop layer selectively with respect to the single-crystal thin layer.

Advantageously, the recrystallizing step a') comprises a heat treatment by laser, applied to the front side of the donor substrate and configured to induce solid phase epitaxy of the amorphized sub-portion.

According to advantageous features of the transfer method according to the first or the second embodiment of the present disclosure, taken alone or in any feasible combination:

the separation step d) comprises a heat treatment at a temperature of less than or equal to 400° C., preferentially at a temperature of between 250° C. and 400° C.;

step a) of providing the donor substrate comprises implanting ions in the upper portion of the substrate, initially of single-crystal quality, to form the amorphized sub-portion;

in step f), the chemical etching of the second layer is selective with respect to the stop layer.

BRIEF DESCRIPTION OF THE DRAWINGS

Other features and advantages of the present disclosure will be clear from the detailed description, made in reference to the appended figures, in which.

The figures are schematic depictions that, for the sake of readability, are not to scale. In particular, the thicknesses of the layers along the z-axis are not to scale relative to the lateral dimensions along the x-axis and the y-axis. The same references in the figures may be used for elements of the same type. The different possibilities (variants and embodiments depicted and/or detailed in the description to follow) must be understood as not being exclusive of one another and may be combined together.

DETAILED DESCRIPTION

The present disclosure relates to a donor substrate 100 for transferring a single-crystal thin layer 1 made of a first material onto a receiver substrate 2. The first material is advantageously chosen from silicon, germanium or a silicon/germanium alloy. In the rest of the description, when the term "first or second" material is used, no structural and crystallographic properties are specified but only its nature: for example, amorphous, polycrystalline or single-crystal silicon constitutes a material within the meaning of the present description.

Figures 1, 2, 3:
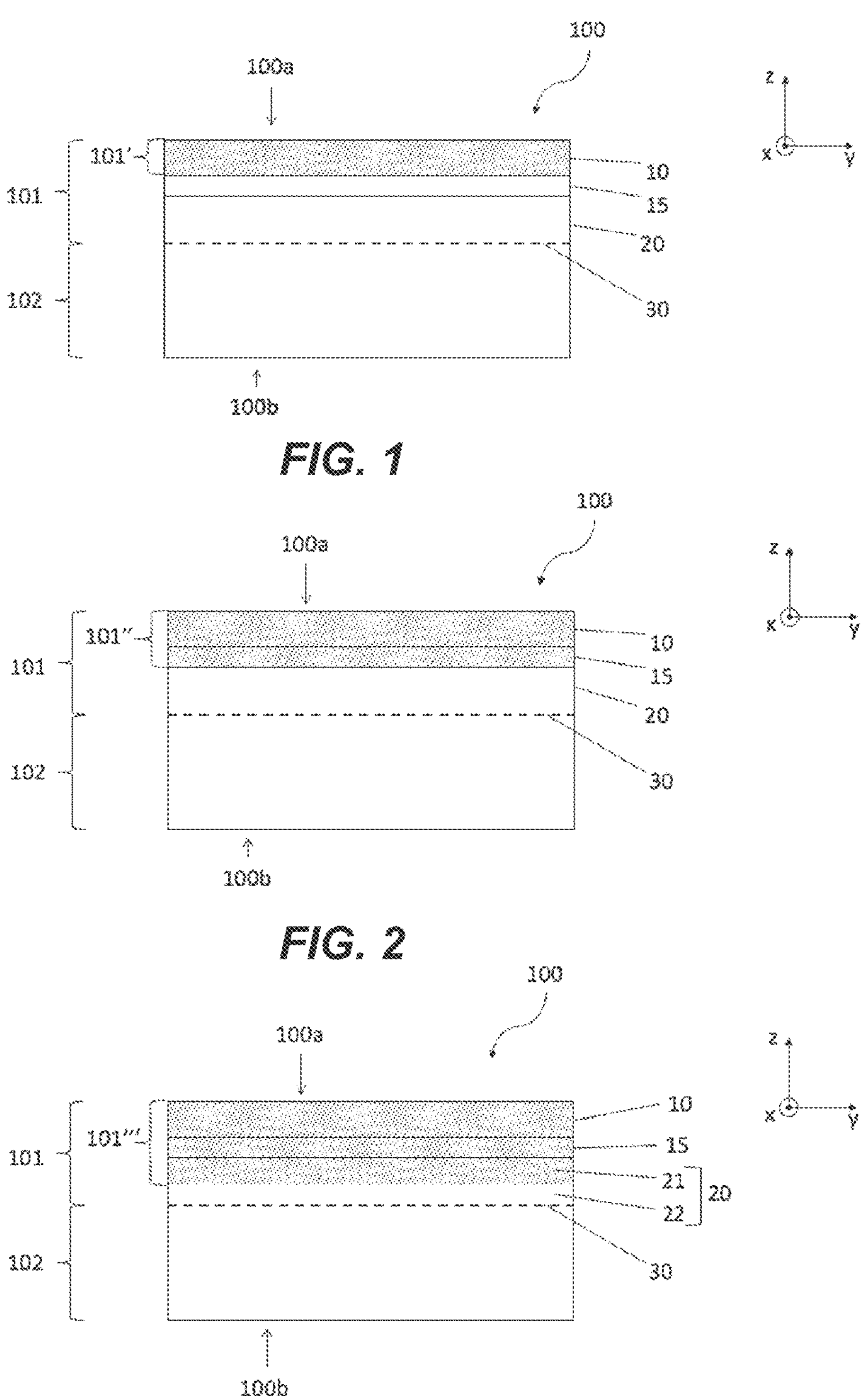
FIGS. 1, 2 and 3 depict a donor substrate according to three variants according to the present disclosure.

The donor substrate 100 is usually in the form of a wafer with a diameter of between 150 mm and 450 mm or even more, and with a thickness typically between 300 and 900 microns. The donor substrate 100 has a front side **100*a* and a back side 100*b* as shown in FIG. 1**.

A buried weakened plane 30 delimits an upper portion 101 and a lower portion 102 of the donor substrate 100. The buried weakened plane 30 extends parallel to the main plane (x, y) of the front side **100*a* of the donor substrate 100**.

The buried weakened plane 30, as is well known in the context of the Smart Cut™ method, is formed from ion implantation of light-mass species, carried out on the side of the front side **100*a* of the donor substrate 100. The implanted species are preferably hydrogen, helium or a combination of these two species. The weakened plane 30** is called that because it comprises nano-cracks in lenticular form generated by the implanted light-mass species.

The donor substrate 100 comprises, in its upper portion 101, a stop layer 15 that extends in a plane parallel to the buried weakened plane 30. The stop layer 15 is formed of a second material capable of providing selective etching with respect to the first material. Typically, the second material is chosen from silicon germanium (SiGe) or highly doped silicon; the first is suitable when the first material is made of silicon or germanium, the second is suitable when the first material is made of silicon, germanium or silicon/germanium. In the case of a second silicon germanium material, the proportion of germanium is typically between 10% and 40%. In the case of a second doped silicon material, a P type boron doping will be preferred, for example, between $1^{E}18$ B/cm$^3$ and $1^{E}20$ B/cm$^3$.

The stop layer 15 is interposed between a first layer 10 on the side of the front side 100*a* and a second layer 20 adjacent to the buried weakened plane 30. The stop layer 15 typically has a thickness between 2 nm and 100 nm.

The first layer 10 and the second layer 20 are arranged on either side of the stop layer 15. The first layer 10 is composed of the first material and is intended to constitute the single-crystal thin layer 1, which will be transferred onto the receiver substrate 2. It may have, for example, a thickness of between 5 nm and 500 nm, depending on the thickness required for the thin layer 1.

The thickness of the second layer 20 may be between 50 nm and 1000 nm. It is understood that the sum of the thicknesses of the first layer 10, of the stop layer 15 and of the second layer 20 is equal to the depth of the buried weakened plane 30.

The second layer 20 may be composed of the first material. Preferentially, the donor substrate 100 is mainly composed of the first material in its single-crystal structure; only the stop layer 15 is formed in the second material to ensure selective etching during the transfer method.

The donor substrate 100 further comprises an amorphized sub-portion 101', 101", 101'" in the upper portion 101. In the context of the present disclosure, amorphized means made amorphous by ion implantation; this implies that the sub-portion 101', 101", 101'", before having an amorphous structure, had a crystalline structure, and even single-crystal structure. The types of ions capable of making the sub-portion 101', 101", 101'" amorphous will thus be detailed hereinafter.

This amorphized sub-portion 101', 101", 101'" includes at least the first layer 10 and extends more or less in depth, having a thickness strictly less than that of the upper portion 101. This amounts to saying that the second layer 20 comprises at least one single-crystal sub-layer 22, adjacent to the buried weakened plane 30.

The amorphized sub-portion 101', 101", 101'" can include one or more of the layers mentioned above. According to a first variant, illustrated in FIG. 1, the amorphized sub-portion 101' only comprises the first layer 10. According to a second variant (FIG. 2), the sub-portion 101" includes the stop layer 15, in addition to the first layer 10. Finally, according to a third variant, illustrated in FIG. 3, the amorphized sub-portion 101'" includes a portion 21 of the second layer 20, adjacent to the stop layer 15. In all the variants, outside of the amorphized sub-portion 101', 101", 101'", a single-crystal sub-layer 22 is found, part of the second layer 20, adjacent to the buried weakened plane 30.

The donor substrate 100, thanks to the presence of an amorphized sub-portion 101', 101", 101'" on the side of the front side 100*a*, which is intended to be assembled onto the receiver substrate 2, is favorable to direct bonding and good reinforcement of the bonding interface. An amorphized surface is deformed better when the temperature is increased and better absorbs the bonding water layers than a single-crystal surface. Consequently, the presence of the amorphized sub-portion 101', 101", 101'" makes it possible to close the bonding interface much better at a lower temperature, as will be indicated below, with reference to the transfer method according to the present disclosure.

Figures 4, 5, 6A, 6B, 6C, 6D:
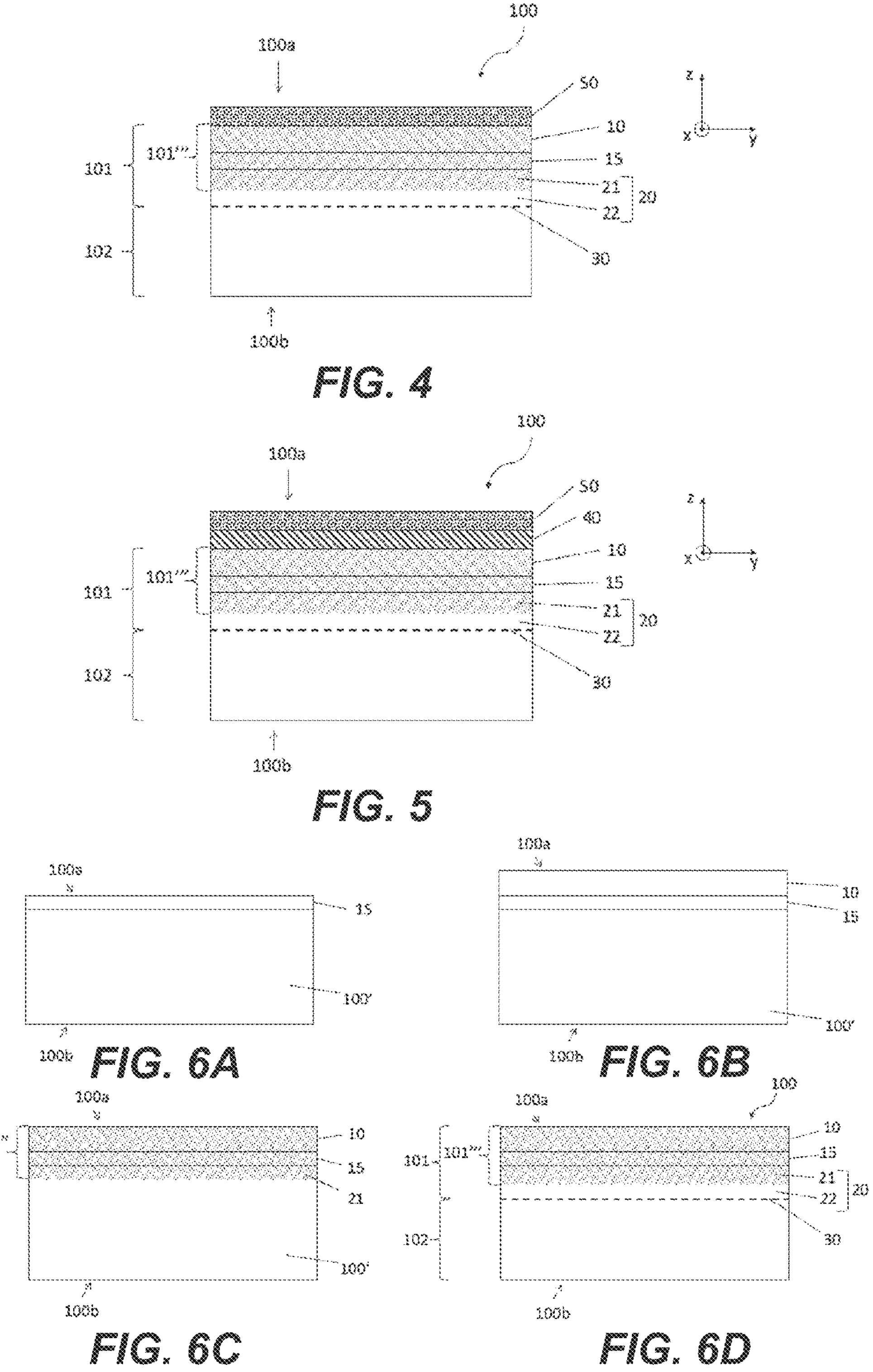
FIGS. 4 and 5 depict a donor substrate according to one embodiment and a variant of this embodiment, according to the present disclosure.
FIGS. 6A-6D depict steps of manufacturing a donor substrate in accordance with the present disclosure.

According to a particular embodiment, the donor substrate 100 additionally comprises an amorphous silicon bonding layer 50 arranged on the first layer 10 (FIG. 4). Such a bonding layer 50 is preferably formed on the first layer 10 by chemical vapor deposition (CVD). The bonding layer 50 has a thickness between 2 nm and 20 nm.

According to a variant of this embodiment, the donor substrate 100 further comprises an intermediate layer 40 made of silicon oxide, interposed between the first layer 10 and the bonding layer 50 (FIG. 5). The intermediate layer 40 typically has a thickness of between 10 and 200 nm. The presence of an intermediate layer made of SiO2 may be useful to electrically insulate the single-crystal thin layer 1 when it will be transferred onto a circuit layer 2*a* of the receiver substrate 2, at the end of the transfer method, the description of which follows.

The present disclosure relates to a method for transferring the single-crystal thin layer 1 formed from the first material, onto a receiver substrate 2.

The method first comprises a step a) of providing a donor substrate 100 as mentioned above.

This step starts from an initial solid single-crystal substrate 100' composed of the first material or of an initial substrate 100' having undergone epitaxy to obtain a single-crystal (not shown) composed of the first material and potentially better quality on the side of its front side 100*a*.

On the front side 100*a* of the initial substrate 100', the stop layer 15 also has a single-crystal structure (FIG. 6A). A stop layer 15 made of SiGe may be formed, for example, by epitaxial growth on the initial substrate 100'. For a stop layer 15 of heavily doped Si, an ion implantation of boron can be carried out in the initial substrate 100' if the latter is made of silicon, in order to produce the layer 15. Alternatively, the stop layer 15 made of heavily doped Si may also be formed by epitaxy. The stop layer 15 typically has a thickness between 2 nm and 100 nm.

A surface layer 10 (called first layer 10) is then formed on the stop layer 15, preferably by epitaxial growth (FIG. 6B). The thickness is chosen according to the targeted application, it being understood that this first layer 10 will form, at the end of the transfer method according to the present disclosure, the single-crystal thin layer 1 transferred onto the receiver substrate 2.

In the case of a stop layer 15 whose lattice parameter is different from that of the first layer 10 and/or of the initial substrate 100', the stop layer 15 preferably has a thickness smaller than a critical thickness (cf. publication by J M. Hartmann et al., "Critical thickness for plastic relaxation of SiGe on Si (001) revised" Journal of Applied Physics 110, 083529 (2011)), for example, less than 50 nm, in order to prevent the stress associated with the difference in lattice parameters from degrading the crystallinity of the first layer 10.

As illustrated in FIG. 6C, an amorphization step is then carried out, from the front side 100*a*, on a sub-portion 101'" that includes at least the first layer 10, and potentially the stop layer 15 and a part 21 of the initial substrate 100' arranged under the stop layer 15 (in accordance with the different variants mentioned with reference to FIGS. 1, 2 and 3).

Amorphization means a disorganization of the crystalline lattice of the sub-portion 101', 101", 101'", which makes the latter amorphous. The amorphization is carried out by ion implantation, usually at room temperature or at a lower temperature, and, for example, from ions having an atomic number greater than or equal to the atomic number of the first material. By way of example, the ions may be chosen from silicon, germanium, xenon and argon. Several successive implantations can be carried out, at different implantation energies, in order to amorphize the sub-portion 101', 101", 101'" over a greater depth and/or more uniformly in depth. The implanted doses typically vary between 2e14/$cm^2$ and 1e16/$cm^2$.

For a first layer 10 and a second layer 20 made of silicon, and a stop layer 15 made of SiGe, the amorphization of the sub-portion 101'" can be obtained, for example, by implanting Ge at a dose of $2.5^E15$ at/$cm^2$ with an energy of 5 keV, for an amorphization over a depth of 15 nm. It should be noted that most of the ion implantation simulation codes provide the indications making it possible to obtain the amorphization of a single-crystal matrix, depending on the nature of the matrix, the nature of the implanted ions, the energy and the implantation dose.

Finally, an implantation of light-mass species, typically hydrogen, helium or a combination of the two, is then carried out at a depth greater than the thickness of the amorphized sub-portion 101', 101", 101'" (FIG. 6D). The buried weakened plane 30, more or less localized at the implantation peak, is thus formed and delimits an upper portion 101 and a lower portion 102 of the donor substrate 100. A single-crystal sub-layer 22 is preserved between the amorphized sub-portion 101'" and the buried weakened plane 30.

The implantation energy is defined according to the depth targeted for the buried weakened plane 30 in the donor substrate 100; it is typically between a few keV and 200 keV. The dose of implanted species may vary between a few $1^E16$ $cm^2$ and $1^E17/cm^2$.

It should be noted that the steps of amorphization and implantation of light-mass species could be carried out in the reverse order, namely firstly the implantation of light-mass species and then the amorphization.

At the end of step a) of the method according to the present disclosure, a donor substrate 100 according to one of the variants illustrated in FIGS. 1, 2 and 3 is obtained.

According to a particular embodiment, a bonding layer 50 and potentially an intermediate layer 40 are formed on the donor substrate 100, in order to obtain one of the variants illustrated in FIGS. 4 and 5.

These layers 40, 50 are produced by, for example, chemical vapor deposition (CVD) and preferentially after the amorphization step in order to prevent the ion implantation of amorphization from causing impurities from these layers 40, 50 in the underlying layers (in particular, in the first layer 10) and making subsequent recrystallization more difficult. Of course, the deposition of the layers 40, 50 must then be able to be carried out at a temperature below the recrystallisation temperature of the amorphized sub-portion 101', 101", 101'". It is also possible to choose to deposit the layer or layers 40, 50 before the steps of amorphization and/or implantation of light-mass species, when the deposition requires temperatures capable of modifying the amorphized sub-portion 101', 101", 101'" and/or of changing the buried weakened plane 30, which is not desirable at this stage of the method.

As will be indicated below, the bonding layer 50, in particular, made of deposited amorphous silicon, promotes the quality of the bonding interface generated in a subsequent assembly step c).

The method then comprises a step b) of providing a support layer 2. It is usually in the form of a small plate of diameter between 150 mm and 450 mm, and of thickness typically between 300 and 900 microns. It can comprise stacks of varied layers, including, in particular, metallic materials, corresponding to layers of devices 2*a* (for example, produced according to the complementary CMOS, metal-oxide-semiconductor technology), arranged on a solid portion, for example, made of a semiconductor material such as silicon. These metal materials typically limit the temperatures applicable to the receiver substrate 2 at 500° C. or less.

The receiver substrate 2 may comprise, with or without a layer of devices, materials that do not support high treatment temperatures, either due to their nature, or due to their thermal expansion coefficient very different from that of the single-crystal thin layer 1 that is to be transferred.

Figures 7A, 7B, 8A, 8B, 9A, 9B:
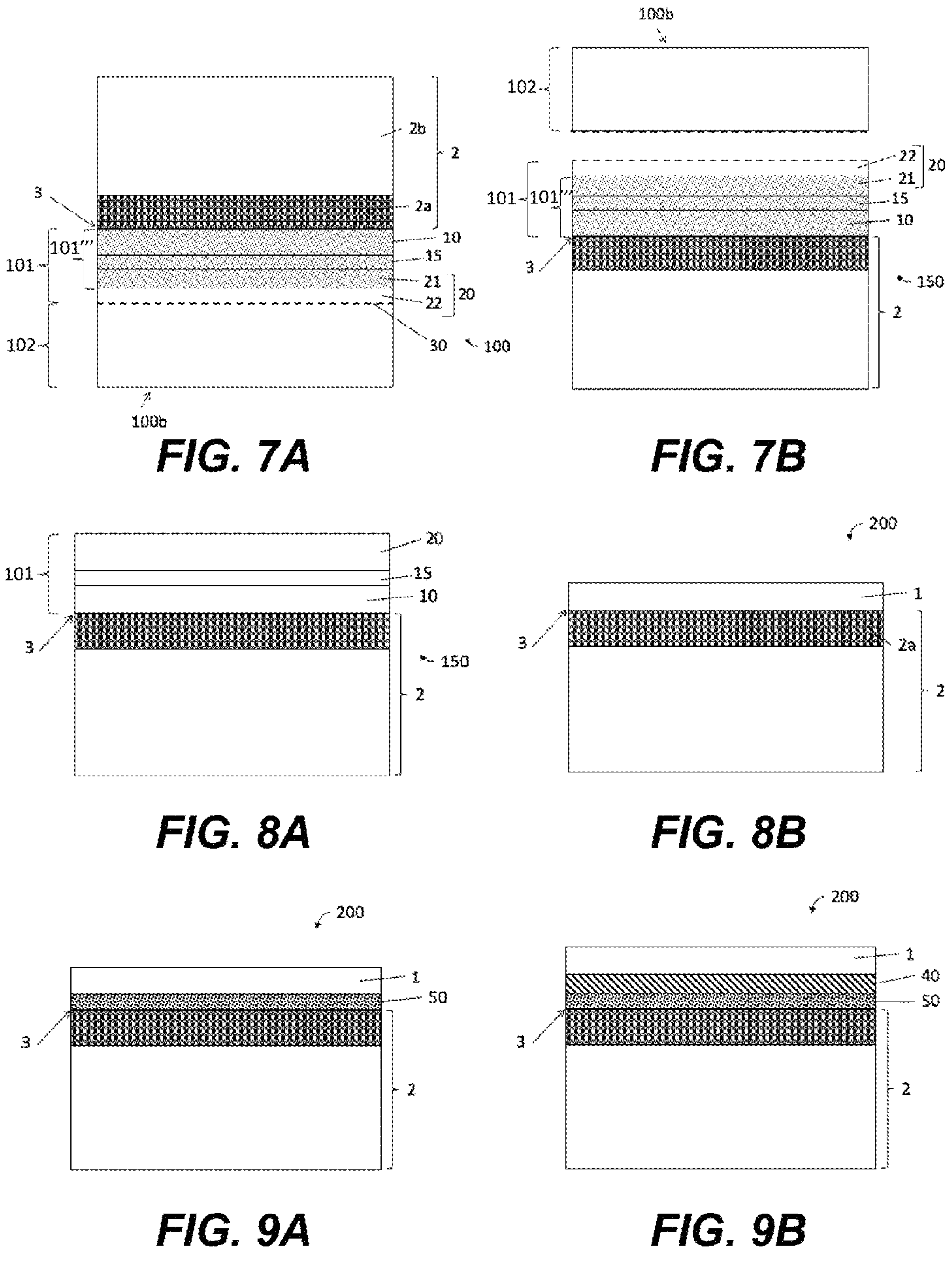
FIGS. 7A-7B and 8A-8B depict steps of a method for transferring a single-crystal thin layer onto a receiver substrate, according to a first embodiment of the present disclosure.
FIGS. 9A-9B depict variants of structures resulting from the transfer method according to the present disclosure.

After steps a) and b), the transfer method comprises a step c) of assembling by direct bonding of the front side 100*a* of the donor substrate 100 onto the receiver substrate 2, to form an assembly bonded at a bonding interface 3 (FIG. 7A). Direct bonding implies that no adhesive material is added between the assembled faces. The very low roughness of the faces (typically less than 0.5 nm RMS) and their high degree of cleanliness allow the implementation of bonding by molecular adhesion of the surfaces. Surface cleaning and/or activations, well known in the field of molecular adhesion bonding, may be applied to the substrates prior to assembly, in order to promote excellent bonding quality. Assembly in a controlled atmosphere is also possible.

The receiver substrate 2, illustrated in FIG. 7A, comprises a device layer 2*a* at its assembled face. In general, the surface film of this layer 2*a* will be formed of silicon oxide or silicon nitride.

When the donor substrate 100 is in one of the forms illustrated in FIGS. 1 to 3, the bonding interface 3 is established between the layer of devices 2*a* and the amorphized sub-portion 101', 101", 101'". The first amorphized layer 10 is particularly favorable to an effective consolidation of the bonding interface 3, even at low temperatures. Indeed, with respect to a single-crystal surface, an amorphized surface deforms better when the temperature is increased and better absorbs the water monolayers present at the interface during bonding by molecular adhesion. Consequently, the presence of the amorphized sub-portion 101', 101", 101'" on the surface allows excellent closure of the bonding interface at low temperature.

Thus, bonding at ambient temperature, and optionally a consolidation annealing at a temperature of less than 350° C., already provide a very good hold of the bonding interface 3, guaranteeing a good progression of the following steps of the method, and, in particular, the separation step d).

When the donor substrate 100 is in one of the forms illustrated in FIGS. 4 and 5, the bonding interface 3 is established between the layer of devices 2*a* and the bonding layer 50 made of amorphous silicon. For the same reasons as noted above, the latter is extremely effective for closing (consolidating) the bonding interface at low temperatures, typically below 500° C. The same type of consolidation annealing as that mentioned above can also be applied.

Step d) for separating the bonded assembly, along the buried weakened plane 30, makes it possible to transfer the upper portion 101 of the donor substrate 100 onto the receiver substrate 2 (FIG. 7B). The separation at the buried weakened plane 30 is preferentially carried out by applying a heat treatment at low temperatures, typically between 200° C. and 500° C., due to the growth of microcracks by coalescence and by pressurizing gaseous species. Advantageously, the heat treatment is carried out at a temperature of less than or equal to 400° C., preferentially at a temperature comprised between 250° C. and 400° C.

Alternatively or jointly, the separation may be caused by the application of a mechanical stress to the bonded assembly.

At the end of this separation, an intermediate SOI structure 150 is obtained on the one hand, as well as the lower portion 102 of the donor substrate on the other hand.

The transfer method according to the present disclosure then comprises a step e) of recrystallization of the amorphized sub-portion 101', 101", 101'", in order to restore a single-crystal quality to the first layer 10.

The recrystallization corresponds to giving the sub-portion 101', 101", 101'" its single-crystal character. It implements a solid phase epitaxy (SPE) phenomenon. Such recrystallization is based on the application of a heat treatment at a temperature at which the crystalline lattice of the sub-portion 101', 101", 101'" is reorganized on the base of the crystalline lattice of the single-crystal sub-layer 22, which acts as a seed.

The recrystallization heat treatment may be carried out at a temperature of between 450° C. and 900° C. Of course, in order to address the aforementioned applications, for which the receiver substrate 2 is not compatible with high temperatures, the thermal recrystallization temperature is advantageously between 450° C. and 550° C. for a period of between 10 min and 50 hours and under a non-oxidizing atmosphere. For example, annealing may be applied at 500° C. for 2 hours to 4 hours in order to recrystallize 15 nm to 20 nm of amorphous silicon.

During the heat treatment, the recrystallisation front moves from the single-crystal sub-layer 22 (or from a single-crystal, part of the second layer 20, of the upper portion 101, adjacent to the amorphized sub-portion) toward the bonding interface 3.

At the end of recrystallization step e), the upper portion 101 of the intermediate structure 150 is entirely single-crystal (FIG. 8A). It should be noted that it is conceivable for the heat treatment applied to the separation step d) to participate in the recrystallization of the amorphized sub-portion 101', 101", 101'", in accordance with its temperature and its duration.

The first layer 10, the single-crystal quality of which is restored, then corresponds to the single-crystal thin layer 1, the transfer of which on the receiver substrate 2 is anticipated. The thin layer 1 will thus have the expected physical and electrical properties for the production of electronic components.

It is possible to measure the thickness and the good crystalline restoration of the first layer 10, respectively, by ellipsometry and by Raman and/or by transmission electron microscopy (TEM).

Depending on the nature of the stop layer 15, certain precautions must be taken to prevent it from being damaged by the recrystallization step e). In particular, in the case of a stop layer 15 made of SiGe, the recrystallisation temperature must be kept below 700° C., or even below 600° C. so as not to relax the SiGe plastically.

The bonding interface 3 benefits from the heat treatments applied during separation step d) and recrystallization step e) since these treatments consolidate the interatomic bonds between the assembled faces.

Thus, the amorphized nature of the first layer 10 promotes, in step c) of the method, the direct bonding between the donor substrate 100 and the receiver substrate 2; it also allows effective repair of crystalline defects linked to the implantation of the light-mass species, while allowing a recrystallization by solid phase epitaxy at low temperatures: the first layer 10 thus regains its single-crystal quality and the associated physical and electrical properties.

Finally, the transfer method comprises a step f) of chemical etching of the second layer 20, then the chemical etching of the stop layer 15 selectively with respect to the first layer 10 (FIG. 8B). Advantageously, the constituent material of the second layer 20 also allows the latter to be etched selectively relative to the stop layer 15.

Known dry etching or wet etching techniques may be implemented. The chemical etching solutions that can be used are typically TMAH (tetramethylammonium hydroxide), TEAH (tetraethylammonium hydroxide) or KOH (potassium hydroxide) for silicon, an HF (hydrofluoric acid)/acetic acid/$H_2O_2$ (hydrogen peroxide) mixture for SiGe, and an HF/acetic acid/$H_2O_2$ or $H_3PO_4$ (phosphoric acid) mixture for germanium.

Step f) makes it possible to remove the second layer 20, which has a relatively high residual roughness (of the order of 10 nm RMS typically) due to the fracture (step d) along the buried weakened plane 30.

A good surface condition (roughness) can be restored due to etching selectivity between the second layer 20 and the stop layer 15. The etching selectivity between the stop layer 15 and the first layer 10 gives the latter a very low surface roughness and retains its uniformity of thickness.

The transfer method thus makes it possible to obtain a structure 200 comprising the single-crystal thin layer 1 arranged on the receiver substrate 2, which may include a layer of devices incompatible with any high-temperature treatment (FIG. 8B).

When the donor substrate 100 comprises a bonding layer 50 or the stack composed of an intermediate layer 40 and a bonding layer 50, the structures 200 obtained are as in FIGS. 9A and 9B.

The present disclosure also relates to a second embodiment of the method for transferring the single-crystal thin layer 1 onto a receiver substrate 2, illustrated in FIGS. 10A-10B and 11A-11B.

This embodiment differs from the method previously described by the positioning of the recrystallization step in the sequence of steps of the method. Indeed, after step a) of supplying the donor substrate 100 (identical to the preceding description), a step a') of local recrystallization of the amorphized sub-portion 101', 101", 101'" is carried out in order to restore a single-crystal quality to the first layer 10, without affecting the buried weakened plane 30, that is to say without affecting the capacity of the buried weakened plane 30 to cause a separation subsequently in the method.

Advantageously, the recrystallization step a') comprises a heat treatment by laser, applied at the front side **100*a* of the donor substrate 100 and configured to induce a solid phase epitaxy of the amorphized sub-portion 101', 101", 101'" (FIG. 10**A). By way of example, this heat treatment can be implemented by means of a UV excimer laser ($\lambda$=308 nm) with pulses of a duration of the order of 200 ns, and an energy density of the order of 0.8 $J/cm^2$.

At the end of step a'), the upper portion 101 of the donor substrate 100 is entirely single-crystal, and the first recrystallized layer 10 forms the single-crystal thin layer 1 intended to be transferred onto the receiver substrate 2.

Step b) of providing the receiver substrate 2, step c) of assembling by direct bonding of the front side **100*a* of the donor substrate 100 onto the receiver substrate 2 (FIG. 10B) and step d) of separation along the buried weakened plane 30 to transfer the upper portion 101 of the donor substrate 100 onto the receiver substrate 2 (FIG. 11**A), are carried out in the second embodiment of the method, in accordance with the first embodiment described above.

There is no recrystallization step e), the latter having been carried out prior to assembly.

Figures 10A, 10B, 11A, 11B:
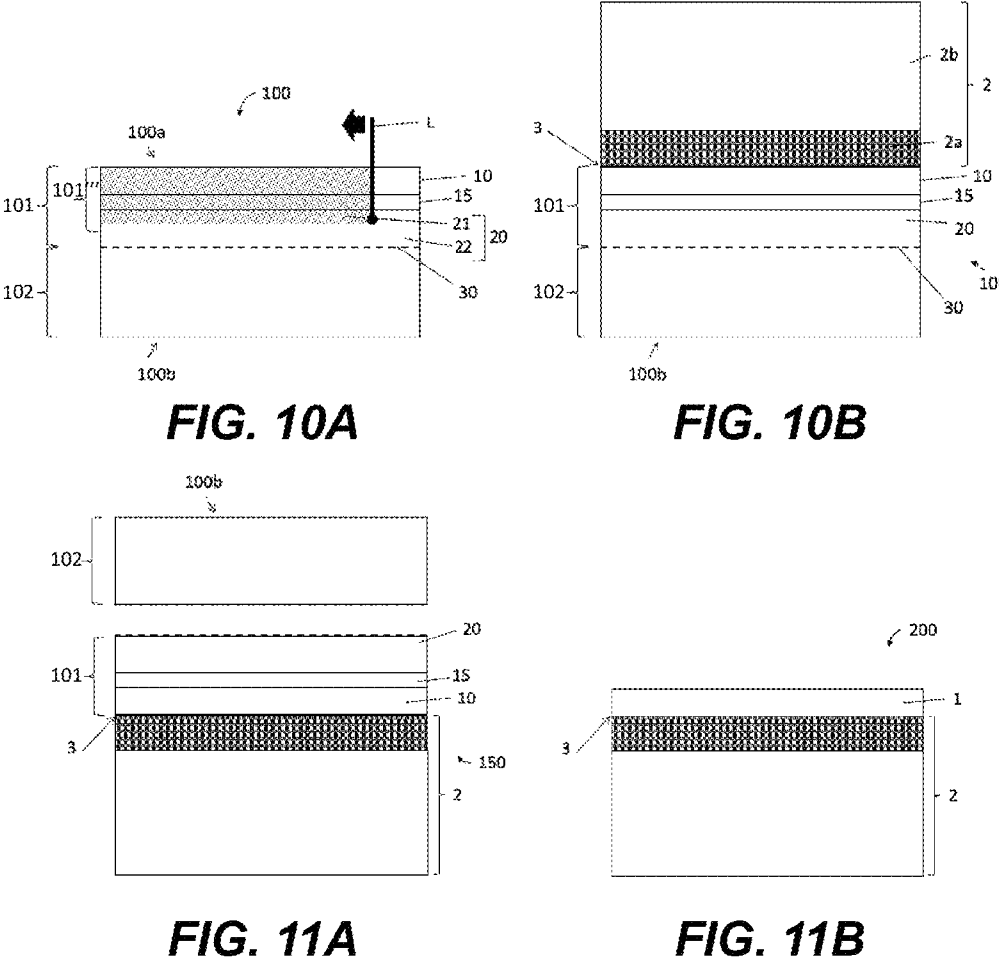
FIGS. 10A-10B and 11A-11B depict steps of a second embodiment of the method for transferring a single-crystal thin layer onto a receiver substrate, according to the present disclosure.

Step f) of chemical etching of the second layer 20, advantageously selectively relative to the stop layer 15, then the chemical etching of the stop layer 15 selectively with respect to the single-crystal thin layer 1, is, however, carried out in an identical manner (FIG. 11B).

The donor substrate 100 according to the present disclosure makes it possible to carry out the transfer (according to the first or the second embodiment of the transfer method) of a single-crystal thin layer 1 of very high crystalline quality, compatible with the production of electronic components, and this without requiring the application of high-temperature heat treatments to carry out the repair of defects related to the implantation of light-mass species, the smoothing of the fractured surface, the thinning of the transferred upper portion 101 and the consolidation of the bonding interface 3.

The configuration of the layers of the donor substrate 100 further simplifies the method of transferring the thin layer 1 onto the receiver substrate 2, by limiting steps c) to f) to heat treatments at low temperatures and selective chemical etchings.

Of course, the present disclosure is not limited to the described embodiments and variant embodiments may be envisaged without departing from the scope of the invention as defined by the claims.

The invention claimed is:

1. A donor substrate for transferring a single-crystal thin layer made of a first material, onto a receiver substrate, the donor substrate having a front side and a back side, and comprising:

a buried weakened plane delimiting an upper portion and a lower portion of the donor substrate;

in the upper portion, a first layer on the side of the front side, a second layer adjacent to the buried weakened plane, and a stop layer between the first layer and the second layer, the first layer being composed of the first material and intended to form the single-crystal thin layer, the stop layer being formed of a second material capable of providing selective etching with respect to the first material; and an amorphized sub-portion, made amorphous by ion implantation, having a thickness less than that of the upper portion, and including at least the first layer, the second layer comprising at least one single-crystal sub-layer, adjacent to the buried weakened plane, the sub-layer being intended to form a recrystallization seed for the amorphized sub-portion.

2. The donor substrate of claim 1, wherein the amorphized sub-portion includes the stop layer.

3. The donor substrate of claim 2, wherein the amorphized sub-portion includes a portion of the second layer, adjacent to the stop layer.

4. The donor substrate of claim 1, wherein the second layer is composed of the first material.

5. The donor substrate of claim 1, wherein the first material is chosen from silicon, germanium or a silicon/germanium alloy.

6. The donor substrate of claim 1, wherein the second material is chosen from silicon germanium or highly doped silicon.

7. The donor substrate of claim 1, further comprising an amorphous silicon bonding layer disposed on the first layer.

8. A method for transferring a single-crystal thin layer made of a first material onto a receiver substrate, comprising the following steps:

a) providing a donor substrate according to claim 1;

b) providing a receiver substrate;

c) directly bonding the front side of the donor substrate onto the receiver substrate;

d) separating along the buried weakened plane to transfer the upper portion of the donor substrate onto the receiver substrate;

e) recrystallizing the amorphized sub-portion to restore a single-crystal quality to the first layer, which then forms the single-crystal thin layer; and f) chemically etching the second layer, then chemically etching the stop layer selectively with respect to the single-crystal thin layer.

9. The method of claim 8, wherein the recrystallization step e) comprises a heat treatment at a temperature of between 450° C. and 900° C.

10. The method of claim 9, wherein the recrystallization step e) comprises a heat treatment at a temperature of between 450° C. and 550° C.

11. The method of claim 8, wherein the separation step d) comprises a heat treatment at a temperature of less than or equal to 400° C.

12. The method of claim 11, wherein the separation step d) comprises a heat treatment at a temperature of between 250° C. and 400° C.

13. The method of claim 8, wherein the step a) of providing the donor substrate comprises implanting ions in the upper portion of the substrate, initially of single-crystal quality, to form the amorphized sub-portion.

14. A method for transferring a single-crystal thin layer made of a first material onto a receiver substrate, comprising the following steps:

a) providing a donor substrate according to claim 1;

a') local recrystallization of the amorphized sub-portion to restore a single-crystal quality to the first layer, without affecting the buried weakened plane, the recrystallized first layer forming the single-crystal thin layer;

b) providing a receiver substrate;

c) directly bonding the front side of the donor substrate onto the receiver substrate;

d) separating along the buried weakened plane to transfer the upper portion of the donor substrate onto the receiver substrate; and f) chemically etching the second layer, then chemically etching the stop layer selectively with respect to the single-crystal thin layer.

15. The method of claim 14, wherein the recrystallization step a') comprises a heat treatment by laser, applied at the front side of the donor substrate and configured to induce solid phase epitaxy of the amorphized sub-portion.

16. The method of claim 14, wherein the separation step d) comprises a heat treatment at a temperature of less than or equal to 400° C.

17. The method of claim 14, wherein the step a) of providing the donor substrate comprises implanting ions in the upper portion of the substrate, initially of single-crystal quality, to form the amorphized sub-portion.

18. The transfer method of claim 14, wherein, in step f), the chemical etching of the second layer is selective with respect to the stop layer.

19. The method of claim 16, wherein the separation step d) comprises a heat treatment at a temperature of between 250° C. and 400° C.

20. The transfer method of claim 14, wherein, in step f), the chemical etching of the second layer is selective with respect to the stop layer.

* * * * *